US012580289B2

(12) United States Patent
Sawaguchi et al.

(10) Patent No.: US 12,580,289 B2
(45) Date of Patent: Mar. 17, 2026

(54) FILTER

(71) Applicant: TDK CORPORATION, Tokyo (JP)

(72) Inventors: Shuhei Sawaguchi, Tokyo (JP);
Tetsuzo Goto, Tokyo (JP); Yuta Ashida, Tokyo (JP); Masahiro Tatematsu, Tokyo (JP); Keigo Shibuya, Tokyo (JP); Tomonori Terui, Tokyo (JP)

(73) Assignee: TDK Corporation, Tokyo (JP)

( * ) Notice: Subject to any disclaimer, the term of this patent is extended or adjusted under 35 U.S.C. 154(b) by 77 days.

(21) Appl. No.: 18/661,108

(22) Filed: May 10, 2024

(65) Prior Publication Data

US 2024/0387969 A1    Nov. 21, 2024

(30) Foreign Application Priority Data

May 16, 2023    (JP) ................................. 2023-080703

(51) Int. Cl.
*H03H 7/01*        (2006.01)
*H01P 1/203*       (2006.01)
*H03H 1/00*        (2006.01)

(52) U.S. Cl.
CPC ....... *H01P 1/20345* (2013.01); *H03H 7/0115* (2013.01); *H03H 2001/0085* (2013.01)

(58) Field of Classification Search
CPC .............. H01P 1/20345; H03H 7/0115; H03H 2001/0085
USPC ................................. 333/175, 185, 202–205
See application file for complete search history.

(56) References Cited

U.S. PATENT DOCUMENTS

2022/0037755 A1* 2/2022 Ogawa .................... H01P 7/082

FOREIGN PATENT DOCUMENTS

WO        2009/060696 A1    5/2009

* cited by examiner

*Primary Examiner* — Rakesh B Patel
(74) *Attorney, Agent, or Firm* — Oliff PLC

(57)        ABSTRACT

A filter includes: a first ground conductor layer and a second ground conductor layer arranged to be spaced from each other, a resonator conductor layer arranged between the first ground conductor layer and the second ground conductor layer and constituting a part of a resonator, a through hole connecting the first ground conductor layers and the resonator conductor layer and constituting a different part of the resonator, and a body. The resonator conductor layer is not directly connected to the second ground conductor layer.

12 Claims, 13 Drawing Sheets

69

691

FILTER

CROSS REFERENCE TO RELATED APPLICATIONS

This application claims the benefit of Japanese Priority Patent Application No. 2023-80703 filed on May 16, 2023, the entire contents of which are incorporated herein by reference.

BACKGROUND OF THE INVENTION

1. Field of the Invention

The present invention relates to a filter including a plurality of resonators.

2. Description of the Related Art

One of electronic components used in a communication apparatus is a band-pass filter including a plurality of resonators. Each of the plurality of resonators is composed of, for example, a conductor layer including a conductor portion that is long in one direction. Miniaturization of band-pass filters used in small-sized communication apparatuses, in particular, has been desired. As band-pass filters suitable for miniaturization, band-pass filters using a stack including a plurality of dielectric layers stacked together and a plurality of conductor layers is known.

WO 2009/060696 discloses a chip-type filter component including a chip body having a structure in which a plurality of dielectric layers are stacked and a resonator electrode provided in the chip body.

The recent market demands for reduction in size and footprint of the compact mobile communication apparatuses and have also required miniaturization of band-pass filters for use in those communication apparatuses. When a band-pass filter includes a plurality of resonators, reduction in size of the band-pass filter causes the electromagnetic coupling between the plurality of resonators to be too strong in some cases. When each of the plurality of resonators is composed of a conductor layer including a conductor portion that is long in one direction, the plurality of conductor layers are formed on the same plane, for example. In this case, to suppress the electromagnetic coupling between the plurality of conductor layers, the distance between the plurality of conductor layers needs to be large. In view of these, it is difficult to miniaturize a band-pass filter including a plurality of resonators.

SUMMARY OF THE INVENTION

An object of the present invention is to provide a filter that can be miniaturized.

A filter of the present invention includes: a first terminal; a second terminal; a first ground conductor layer and a second ground conductor layer each connected to ground and arranged to be spaced from each other; a first resonator conductor layer constituting a part of a first specific resonator arranged between the first ground conductor layer and the second ground conductor layer and provided between the first terminal and the second terminal in circuit configuration; a first through hole connecting the first ground conductor layer and the first resonator conductor layer and constituting a different part of the first specific resonator; and a body composed of a dielectric and integrating the first terminal, the second terminal, the first ground conductor layer, the second ground conductor layer, the first resonator conductor layer, and the first through hole. The first resonator conductor layer is not directly connected to the second ground conductor layer.

In the filter of the present invention, the first resonator conductor layer constituting the part of the first specific resonator is arranged between the first ground conductor layer and the second ground conductor layer. The first through hole constituting the different part of the first specific resonator connect the first ground conductor layer and the first resonator conductor layer. The first resonator conductor layer is not directly connected to the second ground conductor layer. Thus, according to the present invention, it is possible to provide a filter that can be miniaturized.

Other and further objects, features and advantages of the present invention will appear more fully from the following description.

DETAILED DESCRIPTION OF THE PREFERRED EMBODIMENTS

First Embodiment

Figure 1:
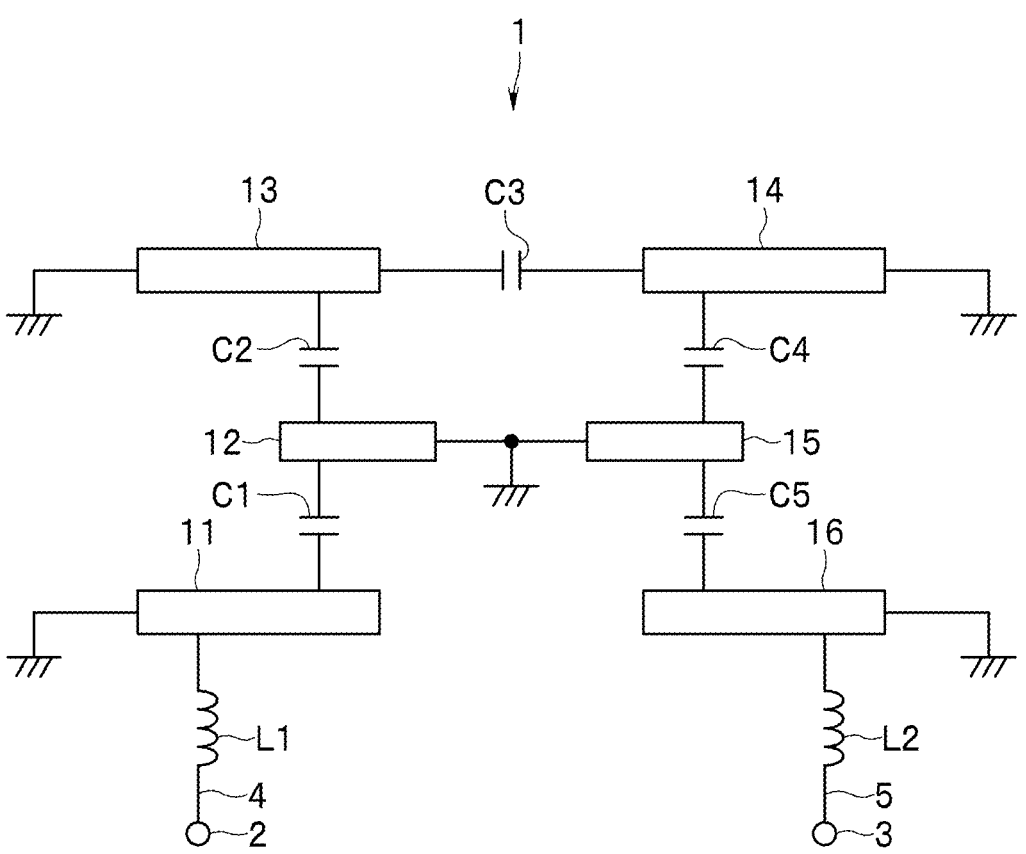
FIG. 1 is a circuit diagram showing an example of a circuit configuration of a filter according to a first embodiment of the present invention.

An embodiment of the present invention will now be described in detail with reference to the drawings. First, reference is made to FIG. 1 to outline a configuration of a filter 1 according to a first embodiment of the present invention. FIG. 1 is a circuit diagram showing a circuit configuration of the filter 1 according to the present embodiment. The filter 1 includes a first terminal 2, a second terminal 3, and a plurality of resonators. Each of the first and second terminals 2 and 3 is a terminal for input or output of a signal. Specifically, when a signal is input to the first terminal 2, a signal is output from the second terminal 3. When a signal is input to the second terminal 3, a signal is output from the first terminal 2.

The plurality of resonators are provided between the first terminal 2 and the second terminal 3 in circuit configuration. The plurality of resonators are configured so that each two resonators adjacent to each other in circuit configuration are electromagnetically coupled. As used herein, the phrase "in circuit configuration" is to describe layout in a circuit diagram, not in a physical configuration.

As shown in FIG. 1, in the present embodiment, the plurality of resonators include six resonators 11, 12, 13, 14, 15, and 16 in particular. The six resonators 11, 12, 13, 14, 15, and 16 are arranged in this order from the first terminal 2 side in circuit configuration. The resonators 11 to 16 are configured so that the resonators 11 and 12 are adjacent to each other in circuit configuration and are electromagnetically coupled to each other, the resonators 12 and 13 are adjacent to each other in circuit configuration and are electromagnetically coupled to each other, the resonators 13 and 14 are adjacent to each other in circuit configuration and are electromagnetically coupled to each other, the resonators 14 and 15 are adjacent to each other in circuit configuration and are electromagnetically coupled to each other, and the resonators 15 and 16 are adjacent to each other in circuit configuration and are electromagnetically coupled to each other. In the present embodiment, the electromagnetic coupling between each two of the resonators adjacent to each other in circuit configuration is specifically capacitive.

The resonators 11 to 16 are configured so that two specific resonators not adjacent to each other in circuit configuration are configured to be electromagnetically coupled. In the present embodiment, a pair of the resonators 12 and 15, a pair of the resonators 11 and 13, and a pair of the resonators 14 and 16 are each configured to be electromagnetically coupled. In the present embodiment, in particular, electromagnetic coupling between the resonators 12 and 15, electromagnetic coupling between the resonators 11 and 13, and electromagnetic coupling between the resonators 14 and 16 are each inductive.

In the present embodiment, in particular, each of the resonators 11 to 16 is a single-ended short-circuit quarter wavelength resonator short-circuited at one end and open at the other end.

The filter 1 further includes a capacitor C1 for establishing capacitive coupling between the resonators 11 and 12, a capacitor C2 for establishing capacitive coupling between the resonators 12 and 13, a capacitor C3 for establishing capacitive coupling between the resonators 13 and 14, a capacitor C4 for establishing capacitive coupling between the resonators 14 and 15, and a capacitor C5 for establishing capacitive coupling between the resonators 15 and 16.

The filter 1 further includes a first transmission path 4 connecting the first terminal 2 and the resonator 11 and a second transmission path 5 connecting the second terminal 3 and the resonator 16. The first transmission path 4 includes an inductor L1. One end of the inductor L1 is electrically connected to the first terminal 2. The other end of the inductor L1 is electrically connected to the resonator 11. Specifically, the resonator 11 is electrically connected to the first terminal 2 through the inductor L1. The first transmission path 4 is electrically connected to the first terminal 2 and the resonator 11.

The second transmission path 5 includes an inductor L2. One end of the inductor L2 is electrically connected to the second terminal 3. The other end of the inductor L2 is electrically connected to the resonator 16. Specifically, the resonator 16 is electrically connected to the second terminal 3 through the inductor L2. The second transmission path 5 is electrically connected to the second terminal 3 and the resonator 12.

As used herein, the phrase "electrically connected" includes a case of being electrically connected through a metal conductor (including an inductor) but does not include a case of being connected through a capacitor.

In the present embodiment, the resonators 11 to 16, the capacitors C1 to C5, and the inductors L1 and L2 are configured so that the filter 1 functions as a band-pass filter that selectively allows a signal of a predetermined frequency band to pass.

Figure 2:
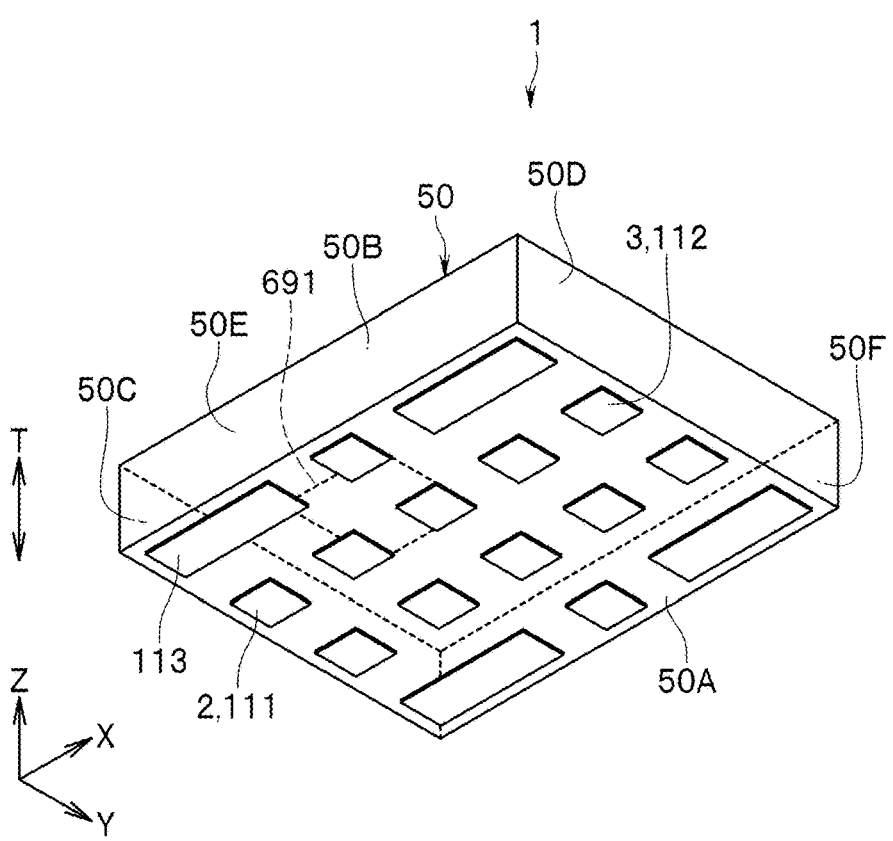
FIG. 2 is a perspective view showing an appearance of the filter according to the first embodiment of the present invention.

Reference is now made to FIG. 2 to describe other configurations of the filter 1. FIG. 2 is a perspective view showing an appearance of the filter 1.

The filter 1 further includes a body 50 that is composed of a dielectric and is for integrating the first terminal 2, the second terminal 3, the resonators 11 to 16, the capacitors C1 to C5, and the inductors L1 and L2. The body 50 includes a plurality of dielectric layers stacked together and a plurality of conductors (a plurality of conductor layers and a plurality of through holes). The resonators 11 to 16, the capacitors C1 to C5, and the inductors L1 and L2 are composed of the plurality of conductors provided in the body 50.

The body 50 has a first surface 50A and a second surface 50B located at both respective ends in a stacking direction T of the plurality of dielectric layers, and four side surfaces 50C to 50F connecting the first surface 50A and the second surface 50B. The side surfaces 50C and 50D are opposite to each other. The side surfaces 50E and 50F are opposite to each other. The side surfaces 50C to 50F are perpendicular to the first surface 50A and the second surface 50B.

Here, X, Y, and Z directions are defined as shown in FIG. 2. The X, Y, and Z directions are orthogonal to one another.

In the present embodiment, a direction parallel to the stacking direction T will be referred to as the Z direction. The opposite directions to the X, Y, and Z directions are defined as −X, −Y, and −Z directions, respectively.

As shown in FIG. 2, the first surface 50A is located at the end of the body 50 in the −Z direction. The first surface 50A also serves as a bottom surface of the body 50. The second surface 50B is located at the end of the body 50 in the Z direction. The second surface 50B also serves as a top surface of the body 50. The side surface 50C is located at the end of the body 50 in the −X direction. The side surface 50D is located at the end of the body 50 in the X direction. The side surface 50E is located at the end of the body 50 in the −Y direction. The side surface 50F is located at the end of the body 50 in the Y direction.

The filter 1 further includes electrodes 111 and 112 provided on the first surface 50A of the body 50. The electrode 111 is arranged near the side surface 50C. The electrode 112 is arranged near the side surface 50D. The electrode 111 corresponds to the first terminal 2, and the electrode 112 corresponds to the second terminal 3. The first and second terminals 2 and 3 are thus provided on the first surface 50A of the body 50.

The filter 1 further includes a plurality of ground electrodes 113 provided on the first surface 50A of the body 50. In the present embodiment, in particular, the plurality of ground electrodes 113 include a plurality of electrodes arranged between the electrodes 111 and 112 and the side surface 50E, a plurality of electrodes arranged between the electrodes 111 and 112 and the side surface 50F, and a plurality of electrodes arranged between the electrode 111 and the electrode 112. Each of the plurality of ground electrodes 113 is connected to the ground.

The first surface 50A faces a mounted body, such as a substrate, not illustrated. The second surface 50B is a surface opposite to the first surface 50A.

Reference is now made to FIG. 3 to FIG. 14 to describe an example of the plurality of dielectric layers and the plurality of conductors constituting the body 50. In this example, the body 50 includes nineteen dielectric layers stacked together. In the following, the nineteen dielectric layers will be referred to as the first to nineteenth dielectric layers in the order from bottom to top. The first to nineteenth dielectric layers are denoted by reference numerals 51 to 69, respectively.

In FIG. 3 to FIG. 12, each circle represents a through hole. The dielectric layers 51 to 67 each have a plurality of through holes. The through holes are each formed by filling a hole intended for a through hole with a conductive paste. Each of the plurality of through holes is connected to an electrode, a conductor layer, or another through hole. In the following description, for a connection relationship between each of the plurality of through holes and the electrode, the conductor layer, and the other through hole, the connection relationship in a state where the first to nineteenth dielectric layers 51 to 69 are stacked together will be described. In FIG. 3 to FIG. 12, a plurality of specific through holes among the plurality of through holes are denoted by respective reference signs.

Figure 3:
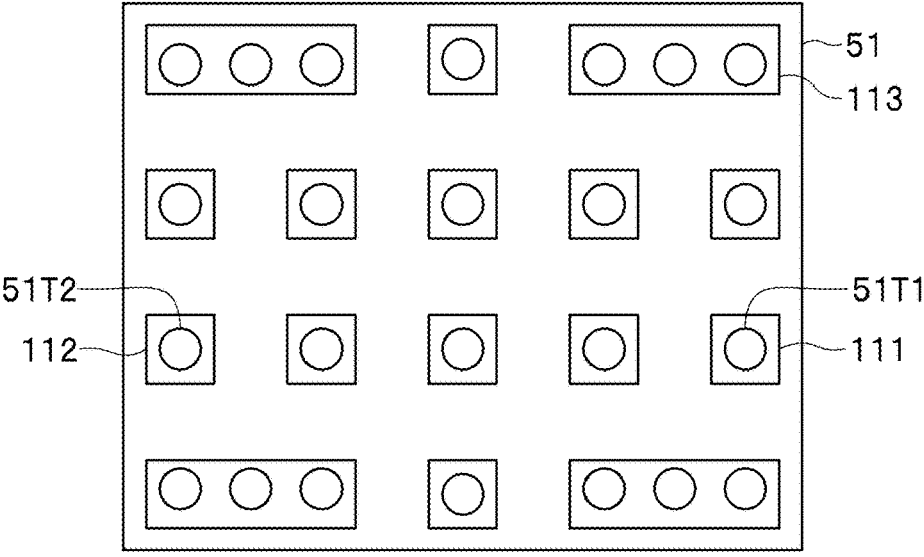
FIG. 3 is an explanatory diagram showing a patterned surface of a first dielectric layer in a body of the filter according to the first embodiment of the present invention.

FIG. 3 shows a patterned surface of the first dielectric layer 51. The electrodes 111 and 112 and the plurality of ground electrodes 113 are formed on the patterned surface of the dielectric layer 51.

In FIG. 3, through holes denoted by respective reference signs 51T1 and 51T2 are connected to the electrodes 111 and 112, respectively. Note that, in the following description, the through hole denoted by the reference sign 51T1 will be referred to simply as a through hole 51T1. Each through hole denoted by a reference sign other than the through hole 51T1 will be referred to similarly as the through hole 51T1.

Figure 4:
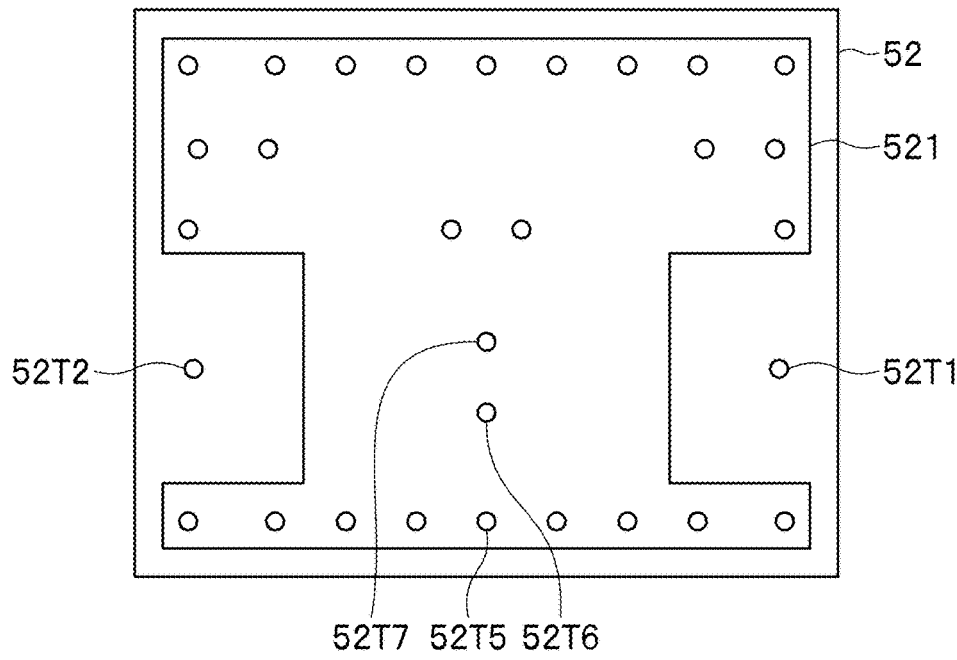
FIG. 4 is an explanatory diagram showing a patterned surface of a second dielectric layer in the body of the filter according to the first embodiment of the present invention.

FIG. 4 shows a patterned surface of the second dielectric layer 52. A ground conductor layer 521 is formed on the patterned surface of the dielectric layer 52. The through holes 51T1 and 51T2 are connected to the through holes 52T1 and 52T2 shown in FIG. 4, respectively. Through holes 52T5, 52T6, and 52T7 shown in FIG. 4 are connected to the ground conductor layer 521.

Figure 5:
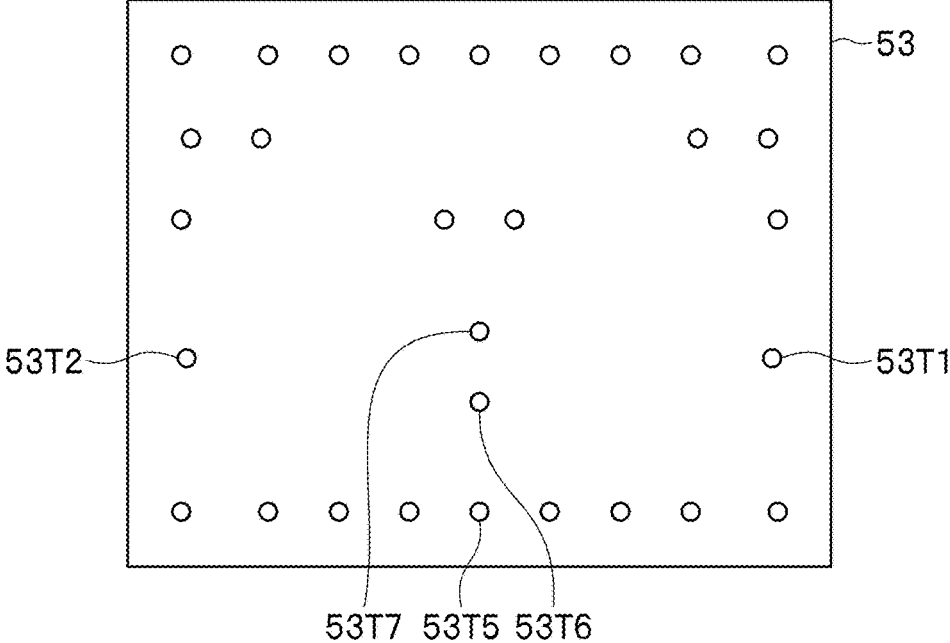
FIG. 5 is an explanatory diagram showing a patterned surface of a third dielectric layer in the body of the filter according to the first embodiment of the present invention.

FIG. 5 shows a patterned surface of the third dielectric layer 53. The through holes 52T1, 52T2, 52T5, 52T6, and 52T7 are connected to through holes 53T1, 53T2, 53T5, 53T6, and 53T7 shown in FIG. 5, respectively.

Figure 6:
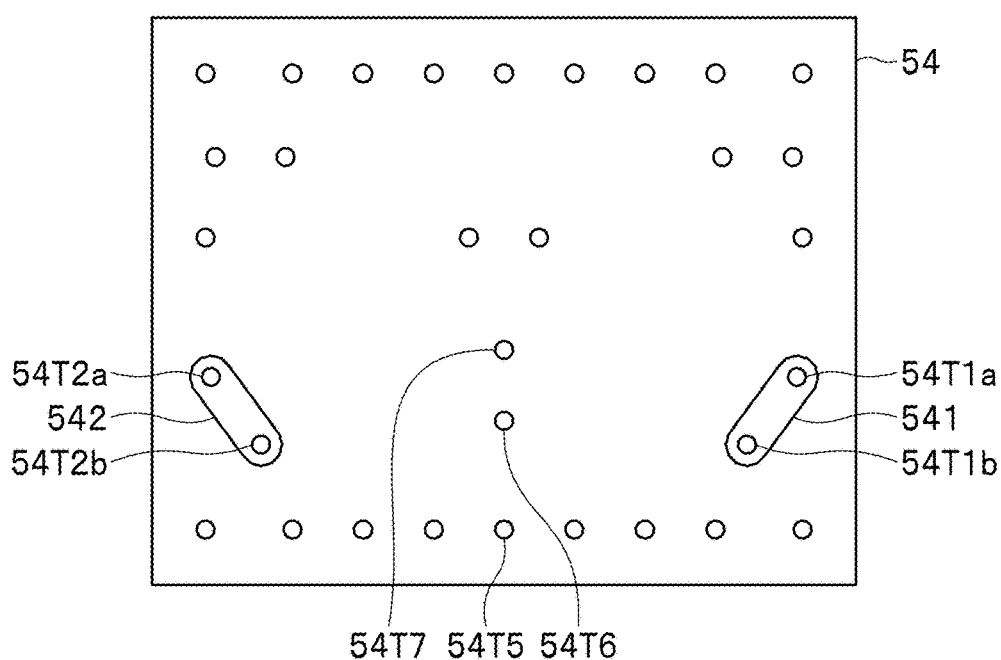
FIG. 6 is an explanatory diagram showing a patterned surface of a fourth dielectric layer in the body of the filter according to the first embodiment of the present invention.

FIG. 6 shows a patterned surface of the fourth dielectric layer 54. Inductor conductor layers 541 and 542 are formed on the patterned surface of the dielectric layer 54. The through hole 53T1 and through holes 54T1a and 54T1b shown in FIG. 6 are connected to the conductor layer 541. The through hole 53T2 and through holes 54T2a and 54T2b shown in FIG. 6 are connected to the conductor layer 542. The through holes 53T5, 53T6, and 53T7 are connected to through holes 54T5, 54T6, and 54T7 shown in FIG. 6, respectively.

Figure 7:
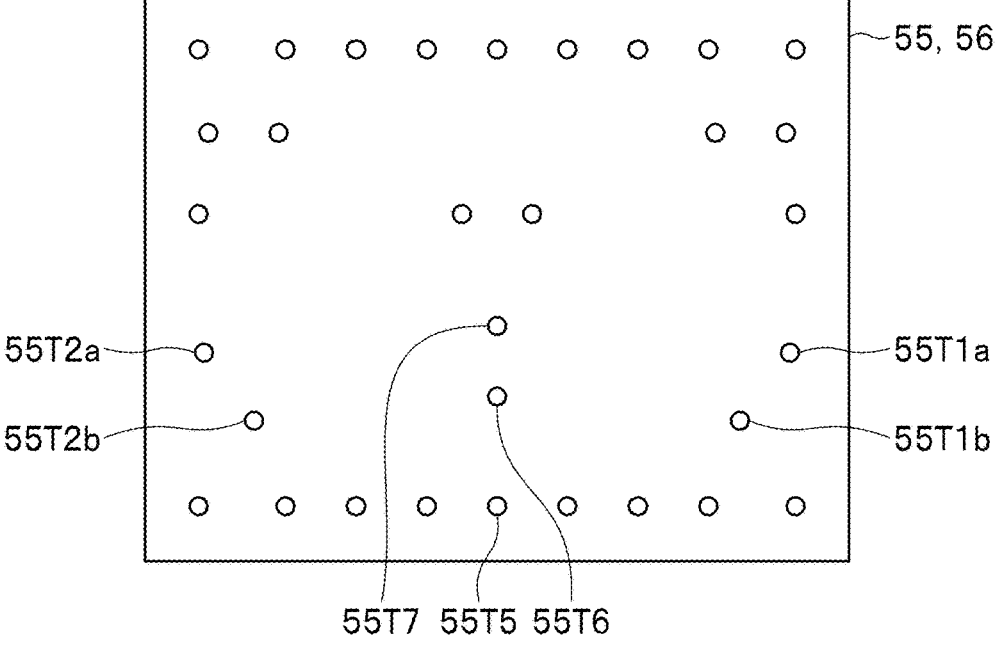
FIG. 7 is an explanatory diagram showing a patterned surface of each of fifth and sixth dielectric layers in the body of the filter according to the first embodiment of the present invention.

FIG. 7 shows a patterned surface of each of the fifth and sixth dielectric layers 55 and 56. The through holes 54T1a, 54T1b, 54T2a, 54T2b, 54T5, 54T6, and 54T7 are connected to through holes 55T1a, 55T1b, 55T2a, 55T2b, 55T5, 55T6, and 55T7 formed in the dielectric layer 55, respectively. In the dielectric layers 55 and 56, every vertically adjacent through holes denoted by the same reference signs are connected to each other.

Figure 8:
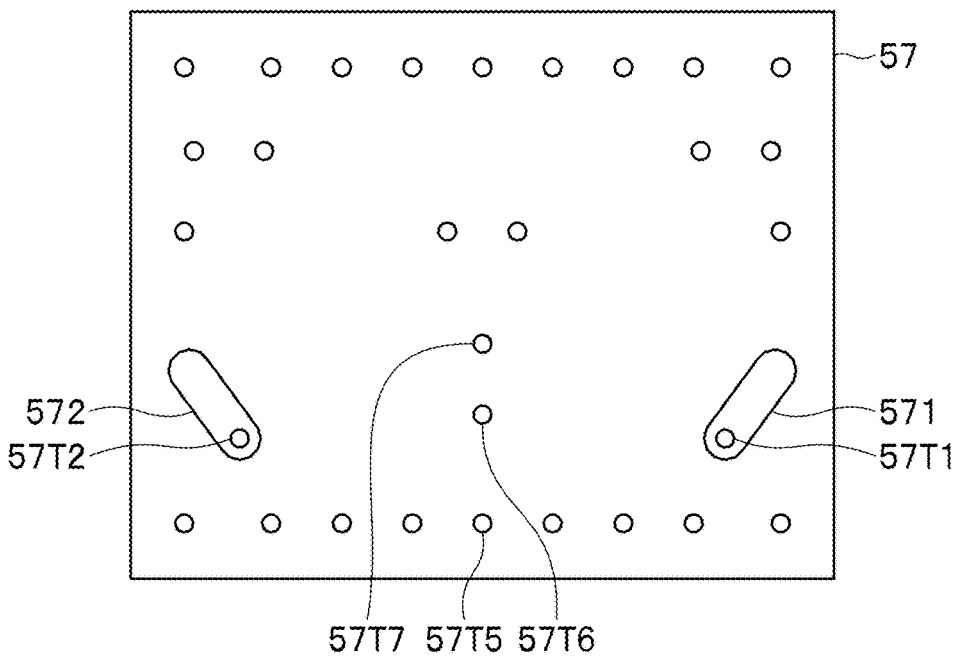
FIG. 8 is an explanatory diagram showing a patterned surface of a seventh dielectric layer in the body of the filter according to the first embodiment of the present invention.

FIG. 8 shows a patterned surface of the seventh dielectric layer 57. Inductor conductor layers 571 and 572 are formed on the patterned surface of the dielectric layer 57. The through holes 55T1a and 55T1b formed in the dielectric layer 56 and a through hole 57T1 shown in FIG. 8 are connected to the conductor layer 571. The through holes 55T2a and 55T2b formed in the dielectric layer 56 and a through hole 57T2 shown in FIG. 8 are connected to the conductor layer 572. The through holes 55T5, 55T6, and 55T7 formed in the dielectric layer 56 are connected to through holes 57T5, 57T6, and 57T7 shown in FIG. 8, respectively.

Figure 9:
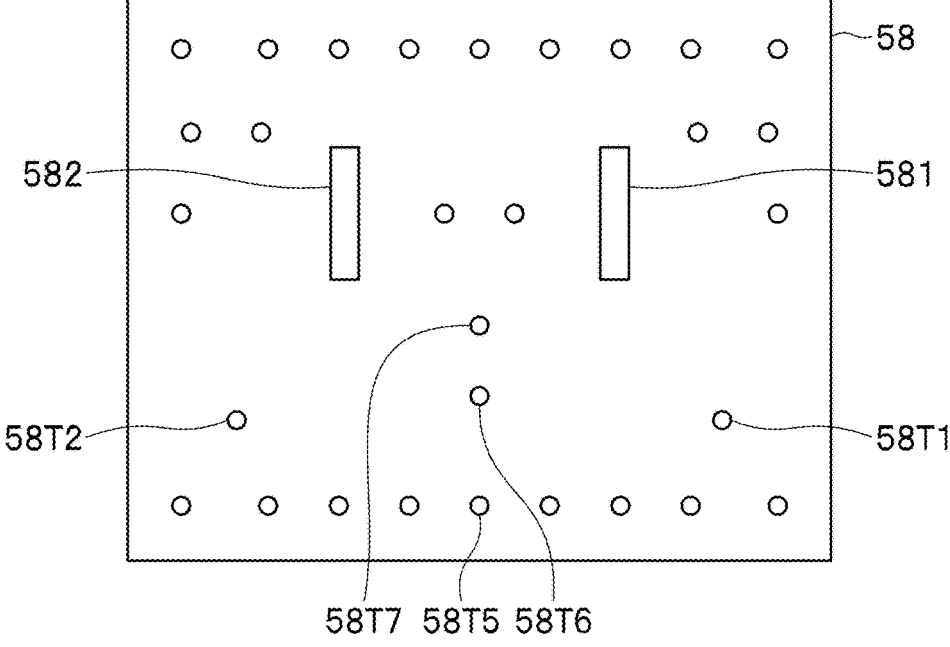
FIG. 9 is an explanatory diagram showing a patterned surface of an eighth dielectric layer of the body of the filter according to the first embodiment of the present invention.

FIG. 9 shows a patterned surface of the eighth dielectric layer 58. Conductor layers 581 and 582 are formed on the patterned surface of the dielectric layer 58. The through holes 57T1, 57T2, 57T5, 57T6, and 57T7 are connected to through holes 58T1, 58T2, 58T5, 58T6, and 58T7 shown in FIG. 9, respectively.

Figure 10:
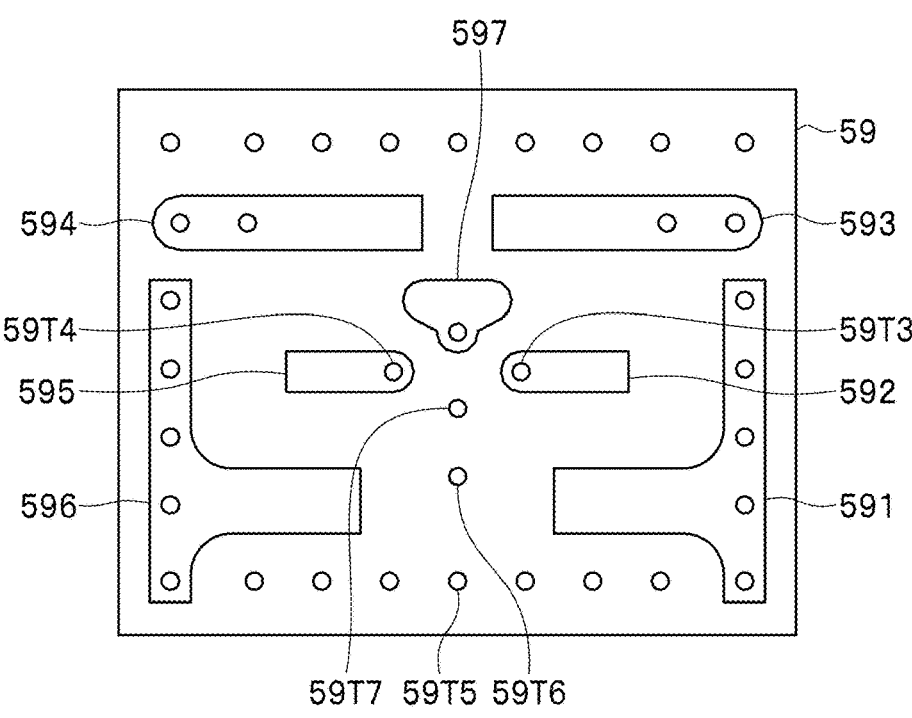
FIG. 10 is an explanatory diagram showing a patterned surface of a ninth dielectric layer in the body of the filter according to the first embodiment of the present invention.

FIG. 10 shows a patterned surface of the ninth dielectric layer 59. Resonator conductor layers 591, 592, 593, 594, 595, and 596 and a conductor layer 597 are formed on the patterned surface of the dielectric layer 59. Each of the conductor layers 591 and 596 includes a portion extending in one direction. Each of the conductor layers 592 to 595 has a shape that is long in one direction.

The through holes 58T1 and 58T2 are connected to the conductor layers 591 and 596, respectively. Through holes 59T3 and 59T4 shown in FIG. 10 are connected to the conductor layers 592 and 595, respectively. The through holes 58T5, 58T6, and 58T7 are connected to through holes 59T5, 59T6, and 59T7 shown in FIG. 10, respectively.

Figure 11:
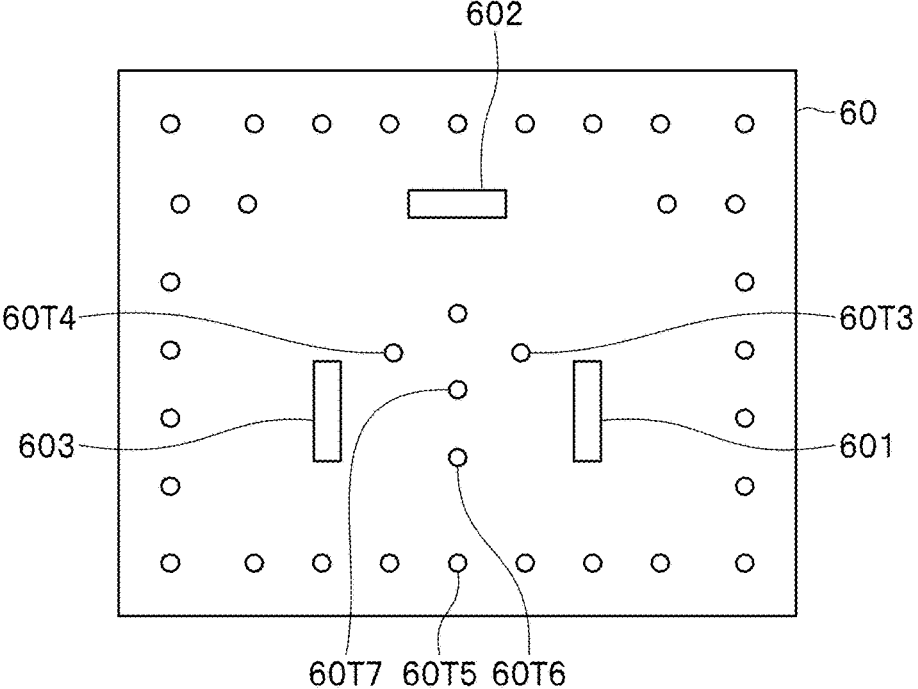
FIG. 11 is an explanatory diagram showing a patterned surface of a tenth dielectric layer in the body of the filter according to the first embodiment of the present invention.

FIG. 11 shows a patterned surface of the tenth dielectric layer 60. Conductor layers 601, 602, and 603 are formed on the patterned surface of the dielectric layer 60. The through holes 59T3, 59T4, 59T5, 59T6, and 59T7 are connected to through holes 60T3, 60T4, 60T5, 60T6, and 60T7 shown in FIG. 11, respectively.

Figure 12:
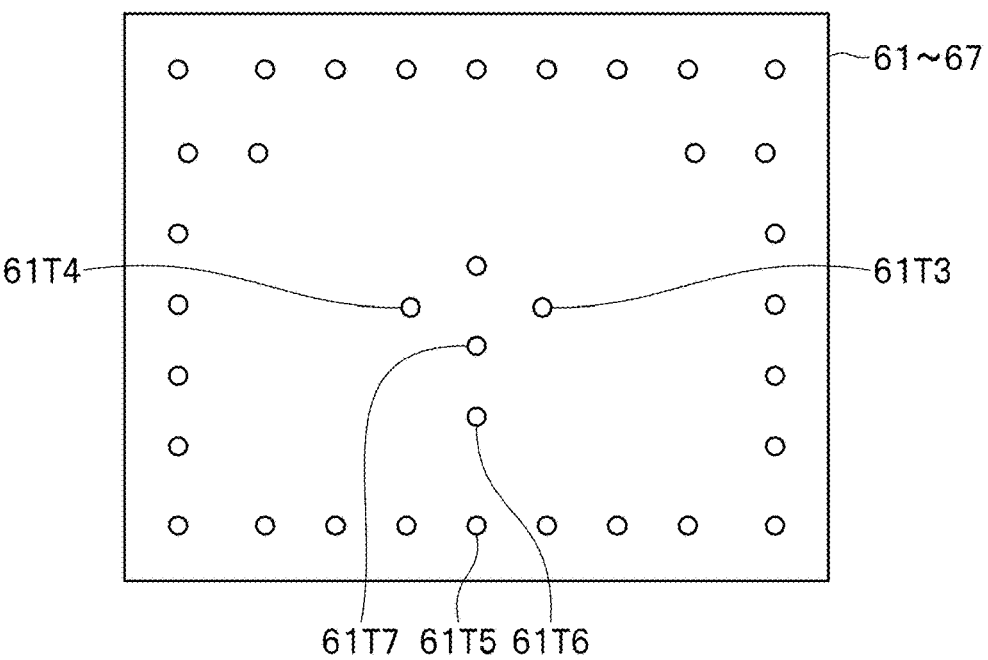
FIG. 12 is an explanatory diagram showing a patterned surface of each of eleventh to seventeenth dielectric layers in the body of the filter according to the first embodiment of the present invention.

FIG. 12 shows a patterned surface of each of the eleventh to seventeenth dielectric layers 61 to 67. The through holes 60T3, 60T4, 60T5, 60T6, and 60T7 are connected to through holes 61T3, 61T4, 61T5, 61T6, and 61T7 formed in the dielectric layer 61, respectively. In the dielectric layers 61 to 67, every vertically adjacent through holes denoted by the same reference signs are connected to each other.

Figure 13:
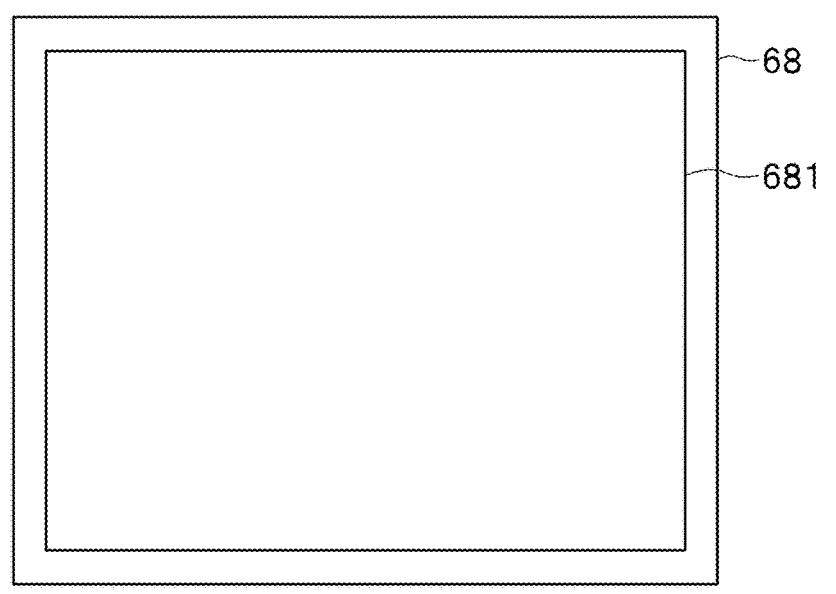
FIG. 13 is an explanatory diagram showing a patterned surface of an eighteenth dielectric layer in the body of the filter according to the first embodiment of the present invention.

FIG. 13 shows a patterned surface of the eighteenth dielectric layer 68. A ground conductor layer 681 is formed on the patterned surface of the dielectric layer 68. The through holes 61T3, 61T4, 61T5, 61T6, and 61T7 formed in the dielectric layer 67 are connected to the ground conductor layer 681.

Figure 14:
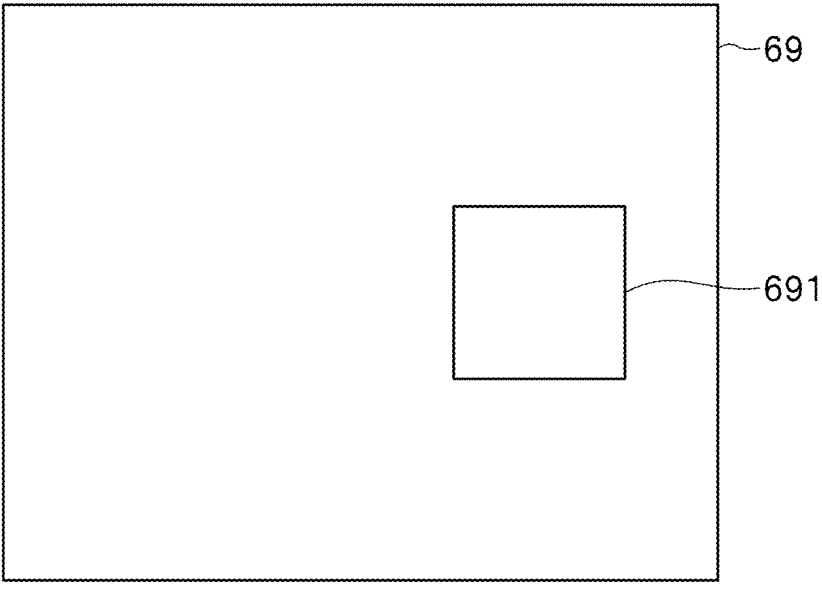
FIG. 14 is an explanatory diagram showing a patterned surface of a nineteenth dielectric layer in the body of the filter according to the first embodiment of the present invention.

FIG. 14 shows a patterned surface of the nineteenth dielectric layer 69. A mark 691 is formed on the patterned surface of the dielectric layer 69.

The body 50 shown in FIG. 2 is formed by stacking the first to nineteenth dielectric layers 51 to 69 such that the patterned surface of the first dielectric layer 51 serves as the first surface 50A of the body 50 and the patterned surface of the nineteenth dielectric layer 69 serves as the second surface 50B of the body 50.

Figure 15:
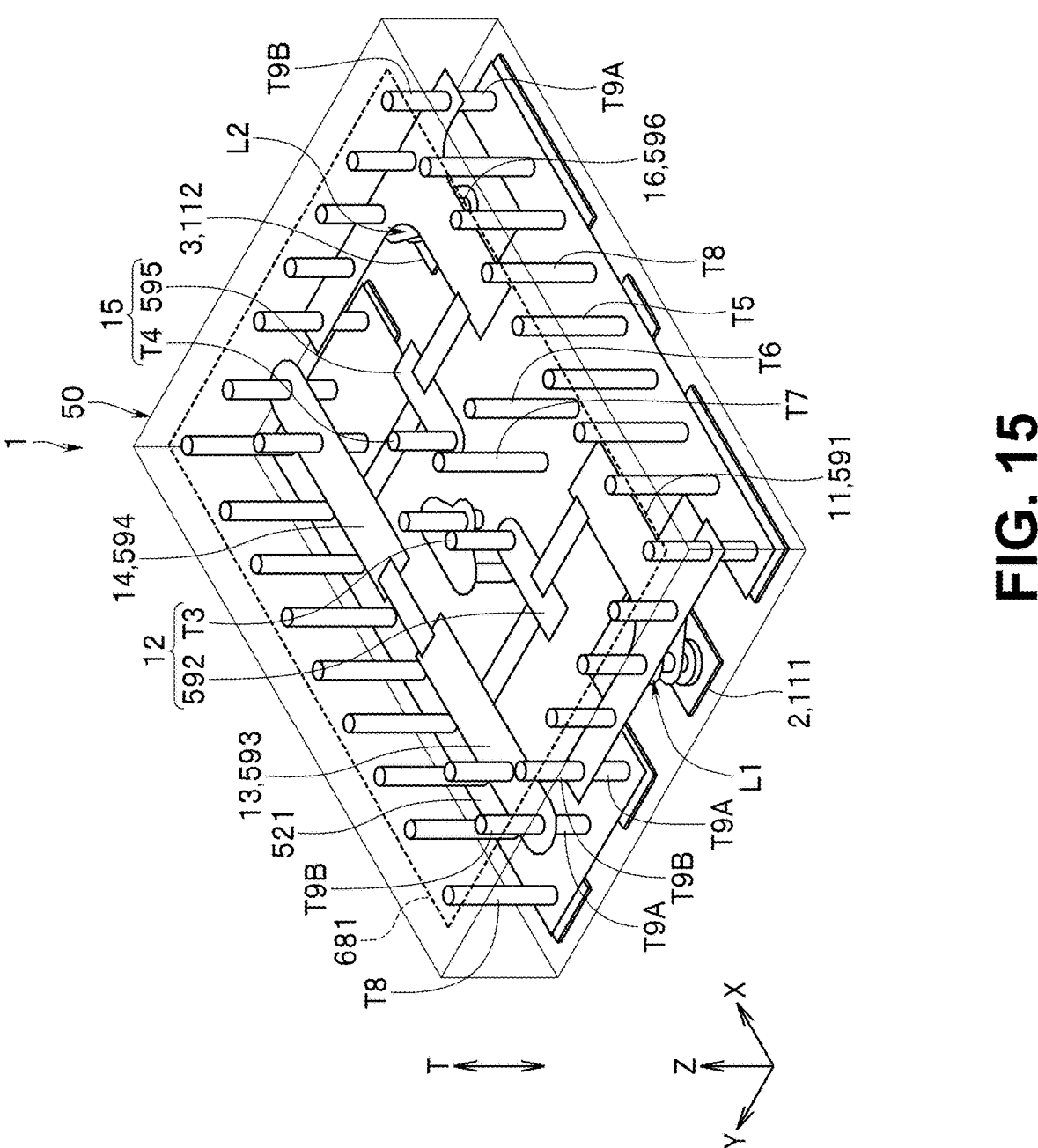
FIG. 15 is a perspective view showing inside of the body of the filter according to the first embodiment of the present invention.

FIG. 15 shows inside of the body 50 formed by stacking the first to nineteenth dielectric layers 51 to 69. As shown in FIG. 15, the plurality of conductor layers and the plurality of through holes shown in FIG. 3 to FIG. 13 are stacked together inside the body 50. Note that, in FIG. 15, the mark 691 is omitted.

Correspondences between the components of the filter 1 shown in FIG. 1 and the internal components of the body 50 shown in FIG. 2 to FIG. 14 will be described below. The resonator 11 is composed of the resonator conductor layer 591. The resonator 12 is composed of the resonator conductor layer 592 and the through holes 59T3, 60T3, and 61T3.

The resonator 13 is composed of the resonator conductor layer 593. The resonator 14 is composed of the resonator conductor layer 594.

The resonator 15 is composed of the resonator conductor layer 595 and the through holes 59T4, 60T4, and 61T4. The resonator 16 is composed of the resonator conductor layer 596.

The capacitor C1 is composed of the conductor layers 591, 592, and 601 and the dielectric layer 59 interposed between those conductor layers. The capacitor C2 is composed of the conductor layers 581, 592, and 593 and the dielectric layer 58 interposed between those conductor layers. The capacitor C3 is composed of the conductor layers 593, 594, and 602 and the dielectric layer 59 interposed between those conductor layers. The capacitor C4 is composed of the conductor layers 582, 594, and 595 and the dielectric layer 58 interposed between those conductor layers. The capacitor C5 is composed of the conductor layers 595, 596, and 603 and the dielectric layer 59 interposed between those conductor layers.

The inductor L1 is composed of the conductor layers 541 and 571 and the through holes 54T1a, 54T1b, 55T1a, and 55T1b. The first transmission path 4 is composed of the conductor layers 541 and 571 and the through holes 54T1a, 54T1b, 55T1a, and 55T1b constituting the inductor L1 and the through holes 51T1, 52T1, 53T1, 57T1, and 58T1.

The inductor L2 is composed of the conductor layers 542 and 572 and the through holes 54T2a, 54T2b, 55T2a, and 55T2b. The second transmission path 5 is composed of the conductor layers 542 and 572 and the through holes 54T2a, 54T2b, 55T2a, and 55T2b constituting the inductor L2 and the through holes 51T2, 52T2, 53T21, 57T2, and 58T2.

Figure 16:
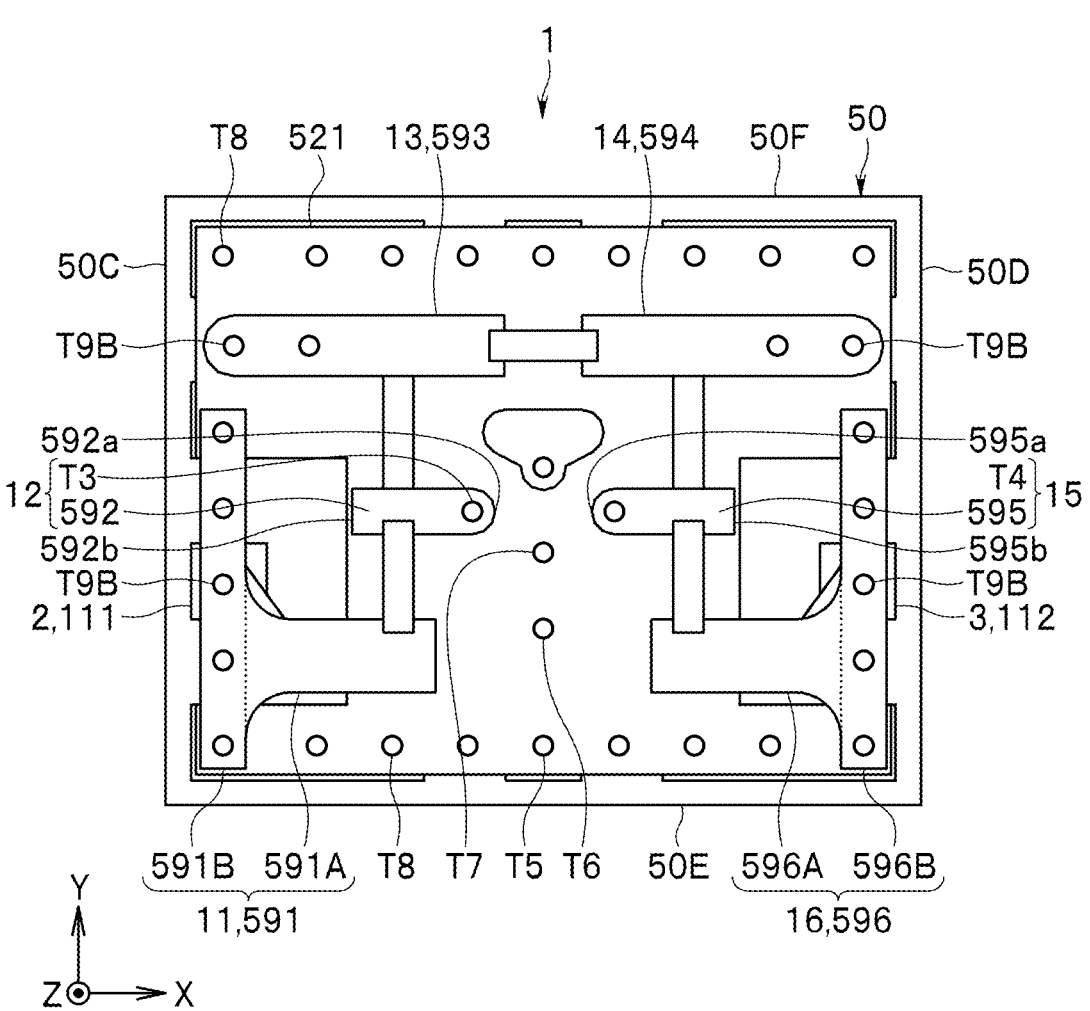
FIG. 16 is a plan view showing the inside of the body of the filter according to the first embodiment of the present invention.
Figure 17:
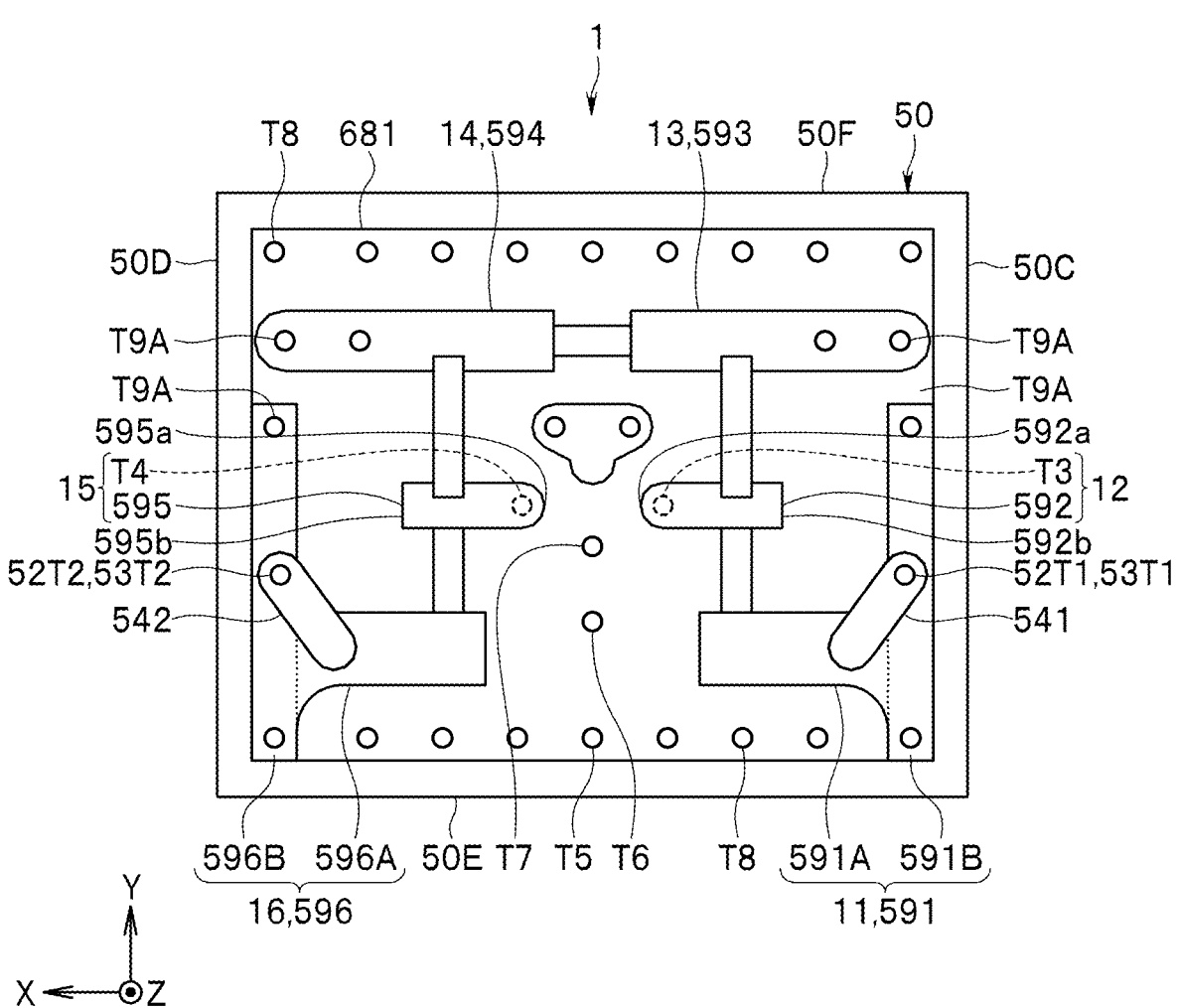
FIG. 17 is a plan view showing the inside of the body of the filter according to the first embodiment of the present invention.

Reference is now made to FIG. 1 to FIG. 17 to describe structural features of the filter 1 according to the present embodiment. FIG. 16 and FIG. 17 are each a plan view showing the inside of the body 50. FIG. 16 shows the inside of the body 50 when viewed from the second surface 50B side. Note that, in FIG. 16, the ground conductor layer 681 and the mark 691 are omitted. FIG. 17 shows the inside of the body 50 when viewed from the first surface 50A side. Note that, in FIG. 17, the electrodes 111 and 112, the plurality of ground electrodes 113, the ground conductor layer 521, the through holes 51T1 and 51T2, and the plurality of through holes connected to the plurality of ground electrodes 113 are omitted.

In FIG. 15, the reference sign T3 denotes a structure formed by connecting the through holes 59T3, 60T3, and 61T3 in series. A structure formed by connecting two or more through holes in series will also be referred to as a through hole below.

The body 50 includes through holes T3, T4, T5, T6, and T7 each formed by connecting two or more through holes in series. One end of the through hole T3 is connected to the resonator conductor layer 592. The other end of the through hole T3 is connected to the ground conductor layer 681.

The through hole T4 is formed by connecting the through holes 59T4, 60T4, and 61T4 in series. One end of the through hole T4 is connected to the resonator conductor layer 595. The other end of the through hole T4 is connected to the ground conductor layer 681.

The through hole T5 is formed by connecting the through holes 52T5, 53T5, 54T5, 55T5, 57T5, 58T5, 59T5, 60T5, and 61T5 in series. The through hole T6 is formed by connecting the through holes 52T6, 53T6, 54T6, 55T6, 57T6, 58T6, 59T6, 60T6, and 61T6 in series. The through hole T7 is formed by connecting the through holes 52T7, 53T7, 54T7, 55T7, 57T7, 58T7, 59T7, 60T7, and 61T7 in series. One end of each of the through holes T5 to T7 is connected to the ground conductor layer 521. The other end of each of the through holes T5 to T7 is connected to the ground conductor layer 681.

The body 50 further includes a plurality of through holes T8, a plurality of through holes T9A, and a plurality of through holes T9B. Each of the plurality of through holes T8, the plurality of through holes TA9, and the plurality of through holes T9B is formed by connecting two or more through holes in series. One end of each of the plurality of through holes T8 and the plurality of through holes T9A is connected to the ground conductor layer 521. Each of the plurality of through holes T9B is connected to any one of the conductor layers 591, 593, 594, 596, and 597. The other end of each of the plurality of through holes T8 and the plurality of through holes T9B is connected to the ground conductor layer 681. The other end of each of the plurality of through holes T9A is connected to any one of the conductor layers 591, 593, 594, 596, and 597.

The plurality of through holes connected to the conductor layer 591 among the plurality of through holes T9A and the plurality of through holes T9B are through holes for connecting the resonator 11 to the ground. In the example shown in FIG. 3 to FIG. 17, the number of the plurality of through holes T9A connected to the conductor layer 591 is two, and the number of the plurality of through holes T9B connected to the conductor layer 591 is five. The two through holes T9A connect the ground conductor layer 521 and the conductor layer 591. The five through holes T9B connect the ground conductor layer 681 and the conductor layer 591.

The plurality of through holes connected to the conductor layer 593 among the plurality of through holes T9A and the plurality of through holes T9B are through holes for connecting the resonator 13 to the ground. In the example shown in FIG. 3 to FIG. 17, the number of the plurality of through holes T9A connected to the conductor layer 593 and the number of the plurality of through holes T9B connected to the conductor layer 593 are each two. The two through holes T9A connect the ground conductor layer 521 and the conductor layer 593. The two through holes T9B connect the ground conductor layer 681 and the conductor layer 593.

The plurality of through holes connected to the conductor layer 594 among the plurality of through holes T9A and the plurality of through holes T9B are through holes for connecting the resonator 14 to the ground. In the example shown in FIG. 3 to FIG. 17, the number of the plurality of through holes T9A connected to the conductor layer 594 and the number of the plurality of through holes T9B connected to the conductor layer 594 are each two. The two through holes T9A connect the ground conductor layer 521 and the conductor layer 594. The five through holes T9B connect the ground conductor layer 681 and the conductor layer 594.

The plurality of through holes connected to the conductor layer 596 among the plurality of through holes T9A and the plurality of through holes T9B are through holes for connecting the resonator 16 to the ground. In the example shown in FIG. 3 to FIG. 17, the number of the plurality of through holes T9A connected to the conductor layer 596 is two, and the number of the plurality of through holes T9B connected to the conductor layer 596 is five. The two through holes T9A connect the ground conductor layer 521 and the conductor layer 596. The five through holes T9B connect the ground conductor layer 681 and the conductor layer 596.

The ground conductor layer 681 is connected to the ground conductor layer 521 via the through holes T5 to T7, the plurality of through holes T8, the plurality of through holes T9A, and the plurality of through holes T9B. The ground conductor layer 521 is connected to the plurality of ground electrodes 113 via the plurality of through holes. Hence, the ground conductor layers 521 and 681 are connected to the ground via the plurality of ground electrodes 113.

Here, a surrounding through hole is defined as follows. First, for each of the plurality of through holes each formed by connecting two or more through holes in series, a side surface closest to the through hole is identified from among the side surfaces 50C to 50F of the body 50. Then, among the plurality of through holes, each through hole having no other through hole between the through hole itself and the identified side surface is defined as a surrounding through hole. A plurality of surrounding through holes are arranged along the side surfaces 50C to 50F. The plurality of surrounding through holes include the through hole T5, one or some of the plurality of through holes T8, one or some of the plurality of through holes T9A, and one or some of the plurality of through holes T9B.

Next, features related to the resonators 12 and 15 will be described. The resonator 12 is composed of the resonator conductor layer 592 and the through hole T3. The resonator 15 is composed of the resonator conductor layer 595 and the through hole T4. The conductor layers 592 and 595 are arranged between the ground conductor layer 521 and the ground conductor layer 681 arranged to be spaced from each other in the body 50. The through hole T3 connects the ground conductor layer 681 and the conductor layer 592. The through hole T4 connects the ground conductor layer 681 and the conductor layer 595. The conductor layers 592 and 595 are not directly connected to the ground conductor layer 521.

The conductor layers 592 and 595 each correspond to a "first resonator conductor layer" of the present invention. The through holes T3 and T4 each correspond to a "first through hole" of the present invention. Hence, the filter 1 according to the present embodiment includes a plurality of first resonator conductor layers and a plurality of first through holes.

Each of the conductor layers 592 and 595 extends in a direction in which the through hole T3 and the through hole T4 are aligned, i.e., a direction parallel to the X direction. The conductor layer 592 and the conductor layer 595 have shapes symmetric to each other with respect to a virtual plane located between the through hole T3 and the through hole T4 and intersecting the direction in which the through hole T3 and the through hole T4 are aligned, i.e., the direction parallel to the X direction. The virtual plane may be a plane parallel to a YZ plane.

The conductor layer 592 has a first end 592a and a second end 592b located at both respective ends in a longitudinal direction of the conductor layer 592. The through hole T3 is connected to a portion near the first end 592a of the conductor layer 592. The conductor layer 592 extends from the first end 592a toward the second end 592b to come away from the conductor layer 595.

The conductor layer 595 has a first end 595a and a second end 595b located at both respective ends in a longitudinal direction of the conductor layer 595. The through hole T4 is connected to a portion near the first end 595a of the conductor layer 595. The conductor layer 595 extends from the first end 595a toward the second end 595b to come away from the conductor layer 592.

The ground conductor layer 521 is arranged at a position closer to the first surface 50A of the body 50 than the ground conductor layer 681 is. The ground conductor layer 681 is arranged at a position closer to the second surface 50B of the body 50 than the ground conductor layer 521 is. In the present embodiment, the ground conductor layer 521 corresponds to a "second ground conductor layer" of the present invention. The ground conductor layer 681 corresponds to a "first ground conductor layer" of the present invention.

Next, features related to the resonators 11 and 16 will be described. The resonator conductor layer 591 constituting the resonator 11 and the resonator conductor layer 596 constituting the resonator 16 are arranged between the ground conductor layer 521 and the ground conductor layer 681.

As shown in FIG. 16 and FIG. 17, the resonator conductor layer 591 constituting the resonator 11 includes a first conductor portion 591A and a third conductor portion 591B connected to the first conductor portion 591A. In FIG. 16 and FIG. 17, the boundary between the first conductor portion 591A and the third conductor portion 591B is indicated with a dotted line.

The through hole 58T1 constituting the first transmission path 4 is connected to the first conductor portion 591A. The third conductor portion 591B is arranged between the first conductor portion 591A and the side surface 50C of the body 50. Two through holes T9A among the plurality of through holes T9A connect the ground conductor layer 521 and the third conductor portion 591B. Five through holes T9B among the plurality of through holes T9B connect the ground conductor layer 681 and the third conductor portion 591B.

As shown in FIG. 16 and FIG. 17, the resonator conductor layer 596 constituting the resonator 16 includes a second conductor portion 596A and a fourth conductor portion 596B connected to the second conductor portion 596A. In FIG. 16 and FIG. 17, the boundary between the second conductor portion 596A and the fourth conductor portion 596B is indicated with a dotted line.

The through hole 58T2 constituting the second transmission path 5 is connected to the second conductor portion 596A. The fourth conductor portion 596B is arranged between the second conductor portion 596A and the side surface 50D of the body 50. Two other through holes T9A among the plurality of through holes T9A connect the ground conductor layer 521 and the fourth conductor portion 596B. Five other through holes T9B among the plurality of through holes T9B connect the ground conductor layer 681 and the fourth conductor portion 596B.

The first conductor portion 591A is electrically connected to the plurality of through holes T9A and the plurality of through holes T9B via the third conductor portion 591B. The second conductor portion 596A is electrically connected to the plurality of through holes T9A and the plurality of through holes T9B via the fourth conductor portion 596B.

The surrounding through holes are arranged to surround the first conductor portion 591A and the second conductor portion 596A while not surrounding the third conductor portion 591B and the fourth conductor portion 596B. The surrounding through holes are further arranged to surround the resonator conductor layers 592 to 595. The surrounding through holes connect the ground conductor layer 521 and the ground conductor layer 681. The ground conductor layers 521 and 681 and the surrounding through holes function as a shield preventing electromagnetic waves from being emitted from the resonators 11 to 16 to the surroundings.

The conductor layers 591 and 596 each correspond to a "second resonator conductor layer" of the present invention. The plurality of through holes T9A each correspond to a "second through hole" of the present invention. The plurality of through holes T9B each correspond to a "third through hole" of the present invention. Hence, the filter 1 according to the present embodiment includes a plurality of second resonator conductor layers, a plurality of second through holes, and a plurality of third through holes.

As described above, in the present embodiment, the number of the plurality of through holes T9A connected to the conductor layer 591 (second through holes) and the number of the plurality of through holes T9B connected to the conductor layer 591 (third through holes) are different from each other. The number of the plurality of through holes T9A connected to the conductor layer 596 (second through holes) and the number of the plurality of through holes T9B connected to the conductor layer 596 (third through holes) are different from each other.

Each of the first conductor portion 591A and the second conductor portion 596A extends in a direction parallel to the X direction. The first conductor portion 591A and the second conductor portion 596A have shapes symmetric to each other with a virtual plane located between the first conductor portion 591A and the second conductor portion 596A and intersecting the direction parallel to the X direction. The virtual plane may be a plane parallel to the YZ plane.

The first conductor portion 591A has a first end and a second end located at both respective ends in a longitudinal direction of the first conductor portion 591A. The third conductor portion 591B is connected to a portion near the first end of the first conductor portion 591A. The first conductor portion 591A extends from the first end toward the second end to come closer to the second conductor portion 596A.

The second conductor portion 596A has a third end and a fourth end located at both respective ends in a longitudinal direction of the second conductor portion 596A. The fourth conductor portion 596B is connected to a portion near the third end of the second conductor portion 596A. The second conductor portion 596A extends from the third end toward the fourth end to come closer to the first conductor portion 591A.

Next, features related to the resonators 13 and 14 will be described. The conductor layer 593 constituting the resonator 13 and the conductor layer 594 constituting the resonator 14 are arranged between the ground conductor layer 521 and the ground conductor layer 681.

Two through holes T9A among the plurality of through holes T9A connect the ground conductor layer 521 and the conductor layer 593. Two other through holes T9A among the plurality of through holes T9A connect the ground conductor layer 521 and the conductor layer 594.

Two through holes T9B among the plurality of through holes T9B connect the ground conductor layer 681 and the conductor layer 593. Two other through holes T9B among the plurality of through holes T9B connect the ground conductor layer 681 and the conductor layer 594.

Each of the conductor layers 593 and 594 extends in a direction parallel to the X direction. The conductor layer 593 and the conductor layer 594 have shapes symmetric to each other with respect to a virtual plane located between the conductor layer 593 and the conductor layer 594 and intersecting the direction parallel to the X direction. The virtual plane may be a plane parallel to the YZ plane.

The conductor layer 593 has a first end and a second end located at both respective ends in a longitudinal direction of the conductor layer 593. The two through holes T9A and the two through holes T9B are connected to portions near the first end of the conductor layer 593. The conductor layer 593 extends from the first end toward the second end to come closer to the conductor layer 594.

The conductor layer 594 has a third end and a fourth end located at both respective ends in a longitudinal direction of the conductor layer 594. The two other through holes T9A and the two other through holes T9B are connected to portions near the third end of the conductor layer 594. The conductor layer 594 extends from the third end toward the fourth end to come closer to the conductor layer 593.

The function and effects of the filter 1 according to the present embodiment will now be described. The filter 1 according to the present embodiment includes the first terminal 2, the second terminal 3, the ground conductor layers 521 and 681, the resonator conductor layers 592 and 595 arranged between the ground conductor layer 521 and the ground conductor layer 681, the through hole T3 connecting the conductor layer 592 and the ground conductor layer 681, and the through hole T4 connecting the conductor layer 595 and the ground conductor layer 681. The conductor layer 592 constitutes a part of the resonator 12 provided between the first terminal 2 and the second terminal 3 in circuit configuration. The conductor layer 595 constitutes a part of the resonator 15 provided between the first terminal 2 and the second terminal 3 in circuit configuration. The through hole T3 constitutes a different part of the resonator 12. The through hole T4 constitutes a different part of the resonator 15. Each of the conductor layers 592 and 595 is not directly connected to the ground conductor layer 521.

In the present embodiment, the part of the resonator 12 extends in a direction orthogonal to the stacking direction T while the different part of the resonator 12 extends in the stacking direction T. In the present embodiment, the part of the resonator 15 extends in the direction orthogonal to the stacking direction T while the different part of the resonator 15 extends in the stacking direction T. In view of these, according to the present embodiment, the plane shape (shape viewed in the Z direction) of the body 50 of the filter 1 can be reduced in size compared to a case where the entire of each of the resonators 12 and 15 extends in the direction orthogonal to the stacking direction T. Thus, according to the present embodiment, the filter 1 can be miniaturized.

Moreover, according to the present embodiment, the filter 1 can be miniaturized compared to a case where each of the conductor layers 592 and 595 is directly connected to both the ground conductor layer 521 and the ground conductor layer 681. The effects of this will be described in detail below. In one example, the resonance frequency of the resonator 12 is 29.95 GHz when each of the conductor layer 592 and the through hole T3 is set at certain dimensions. The resonance frequency of a resonator of a first comparative example is 43.51 GHz when each of the conductor layer 592 and the through hole T3 is set at the same dimensions and the conductor layer 592 is directly connected to the ground conductor layers 521 and 681. In the resonator of the first comparative example, the dimensions of the conductor layer 592 need to be increased to have a resonance frequency of 29.95 GHz. In other words, according to the present embodiment, the dimensions of the conductor layer 592 for achieving a desired resonance frequency can be smaller than those of the resonator of the first comparative example.

The above description about the resonance frequency of the resonator 12 also applies to the resonance frequency of the resonator 15. Hence, according to the present embodiment, the dimensions of each of the conductor layers 592 and 595 can be smaller than those in a case where each of the conductor layers 592 and 595 is directly connected to the ground conductor layers 521 and 681. Consequently, according to the present embodiment, the filter 1 can be miniaturized.

In the present embodiment, the resonator 11 and the resonator 12 are adjacent to each other in circuit configuration. The conductor layer 591 constituting the resonator 11 and the conductor layer 592 constituting the part of the resonator 12 extend in the direction orthogonal to the stacking direction T. The through hole T3 constituting the different part of the resonator 12 extends in the stacking direction T. Hence, in the present embodiment, the part of the resonator 12 is orthogonalized to the direction in which the conductor layers constituting the resonator 11 extend. In other words, in the present embodiment, the electromagnetic field generated from the part of the resonator 12 is orthogonalized to the electromagnetic field generated from the resonator 11. Hence, according to the present embodiment, the strength of the electromagnetic coupling between the resonator 11 and the resonator 12 can be suppressed compared to a case where the entire resonator 12 extends in the direction orthogonal to the stacking direction T. In other words, according to the present embodiment, it is possible to miniaturize the filter 1 while preventing the electromagnetic coupling between the resonator 11 and the resonator 12 from being too strong.

Similarly, according to the present embodiment, it is possible to suppress each of the strength of the electromagnetic coupling between the resonator 12 and the resonator 13, the strength of the electromagnetic coupling between the resonator 14 and the resonator 15, and the strength of the electromagnetic coupling between the resonator 15 and the resonator 16. Hence, according to the present embodiment, it is possible to miniaturize the filter 1 while preventing the electromagnetic coupling between a plurality of resonators from being too strong.

A description will be now given of a result of a simulation of finding the strength of the electromagnetic coupling between a plurality of resonators. In the simulation, a model of a comparative example, a model of a first example, and a model of a second example were used. The model of the comparative example is a model of the filter 1 including a resonator of a second comparative example instead of the resonator 12. The resonator of the second comparative example is composed of a through hole entirely extending in the stacking direction T.

Each of the model of the first example and the model of the second example is a model of the filter 1 according to the present embodiment. In the model of the second example, the diameter of the through hole T3 is 1.5 times larger than that of the model of the first example.

In the simulation, while the resonance frequencies of the resonator of the second comparative example and the resonator 12 were made approximately the same, the coupling coefficient between the resonator 11 and the resonator 12 and the coupling coefficient between the resonator 12 and the resonator 13 were obtained. The resonance frequency of the resonator of the second comparative example is 29.93 GHZ. In the model of the first example, the resonance frequency of the resonator 12 is 29.95 GHz. In the model of the second example, the resonance frequency of the resonator 12 is 29.96 GHz.

In each of the model of the comparative example, the model of the first example, and the model of the second example, the resonance frequency of the resonator 11 is 27.53 GHZ, and the resonance frequency of the resonator 13 is 29.51 GHz.

The results of the simulation will be described below. In the model of the comparative example, the coupling coefficient between the resonator 11 and the resonator 12 is 0, and the coupling coefficient between the resonator 12 and the resonator 13 is 0.009. In the model of the first example, the coupling coefficient between the resonator 11 and the resonator 12 is 0.065, and the coupling coefficient between the resonator 12 and the resonator 13 is 0.046. In the model of the second example, the coupling coefficient between the resonator 11 and the resonator 12 is 0.076, and the coupling coefficient between the resonator 12 and the resonator 13 is 0.051.

From the result of the model of the comparative example and the result of the model of the first example, it is found that extending the resonator 12 in the stacking direction T can reduce the coupling coefficient. In other words, these results show that extending the resonator 12 in the stacking direction T can suppress the strength of the electromagnetic coupling between the resonator 11 and the resonator 12 and the strength of the electromagnetic coupling between the resonator 12 and the resonator 13. Note that extending the resonator 12 entirely in the stacking direction T as in the model of the comparative example reduces the coupling coefficient too much. Hence, it is preferable to extend only a part of the resonator 12 in the stacking direction T.

From the result of the model of the first example and the result of the model of the second example, it is found that reducing the diameter of the through hole T3 can reduce the coupling coefficient. When the length of the through hole T3 is fixed for comparison, the smaller the diameter of the through hole T3 becomes, the larger the value of the inductance of the through hole T3 becomes. Hence, to achieve the same resonance frequency while reducing the diameter of the through hole T3, the length of the conductor layer 592 becomes smaller. Hence, it is possible to suppress the strength of the electromagnetic coupling between the conductor layer 592 and the conductor layer 591 or the conductor layer 593.

Other effects of the present embodiment will now be described. In the present embodiment, the conductor layer 592 constituting the part of the resonator 12 extends from the first end 592a toward the second end 592b to come away from the conductor layer 595 constituting the part of the resonator 15. The conductor layer 595 extends from the first end 595a toward the second end 595b to come away from the conductor layer 592. The through hole T3 is connected to the portion near the first end 592a of the conductor layer 592. The through hole T4 is connected to the portion near the first end 595a of the conductor layer 595. When the conductor layers 592 and 595 or the through holes T3 and T4 are displaced in a direction parallel to the X direction due to manufacturing variation, one of the conductor layers 592 and 595 becomes longer while the other becomes shorter. Thus, according to the present embodiment, it is possible to cancel a change in characteristics of the resonators 12 and 15 due to a change in length of the conductor layers 592 and 595.

The above description about the pair of resonators 12 and 15 also applies to the pair of resonators 11 and 16 and the pair of resonators 13 and 14. In view of these, according to the present embodiment, it is consequently possible to suppress a change in characteristics of the filter 1 due to manufacturing variation.

Figure 18:
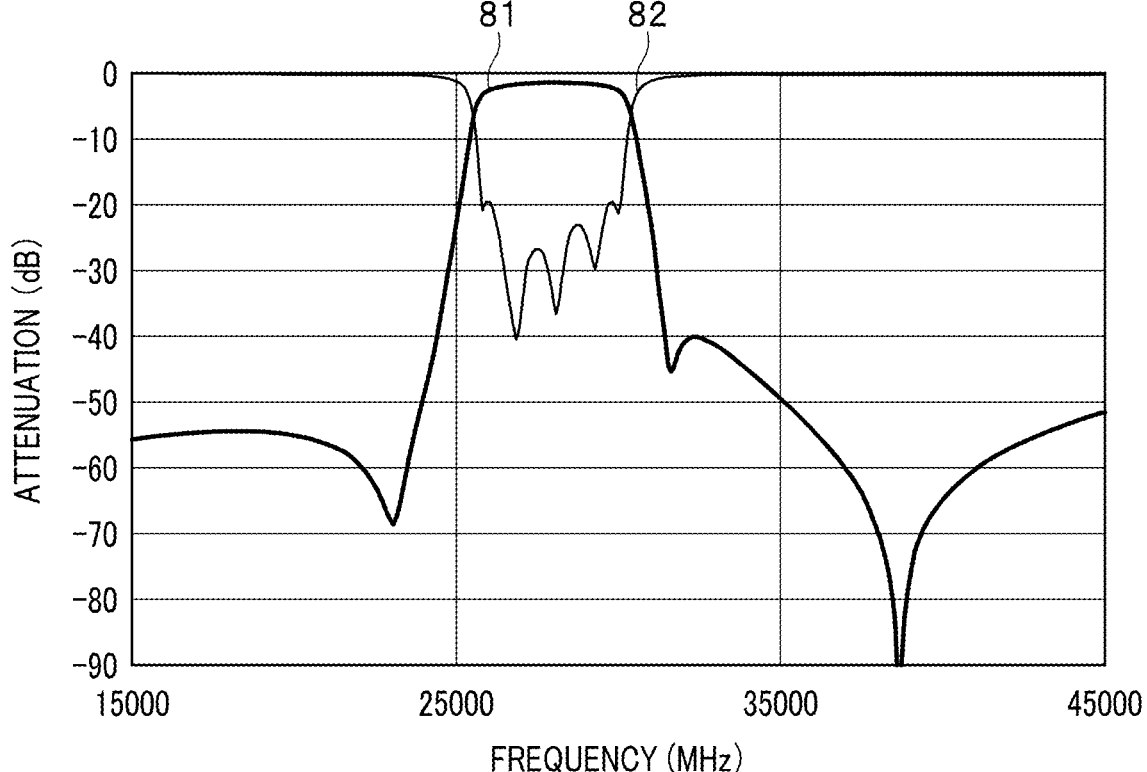
FIG. 18 is a characteristic chart showing an example of pass attenuation characteristics and return attenuation characteristics of the filter according to the first embodiment of the present invention.

Next, an example of the characteristics of the filter 1 according to the present embodiment will be described. FIG. 18 is a characteristic chart showing an example of pass attenuation characteristics and return attenuation characteristics of the filter 1. In FIG. 18, the horizontal axis represents frequency, and the vertical axis represents attenuation. In FIG. 18, the curve denoted by the reference numeral 81 represents the pass attenuation characteristics between the first terminal 2 and the second terminal 3, and the curve denoted by the reference numeral 82 represents the return attenuation characteristics in the first terminal 2. From FIG. 18, it is apparent that the filter 1 according to the present embodiment has sufficient characteristics as a band-pass filter from a practical perspective.

Second Embodiment

Figure 19:
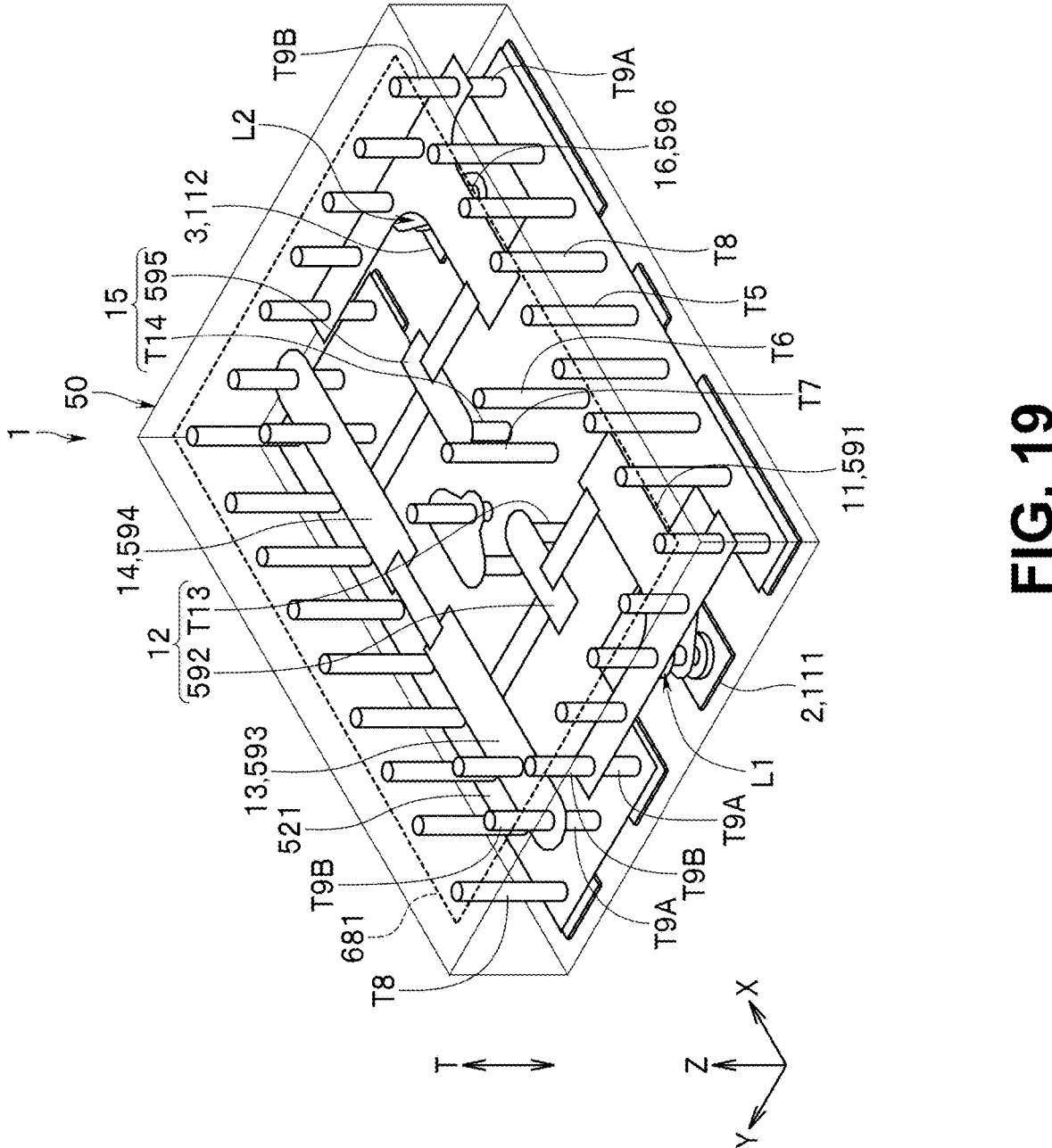
FIG. 19 is a perspective view showing inside of the body of the filter of a second embodiment of the present invention.

Next, a second embodiment of the present invention will be described with reference to FIG. 19. FIG. 19 is a perspective view showing inside of the body 50 of a filter 1 according to the present embodiment.

The filter 1 according to the present embodiment includes a through hole T13 instead of the through hole T3 of the first embodiment. In the present embodiment, the resonator 12 is composed of the resonator conductor layer 592 and the through hole T13. The through hole T13 connects the ground conductor layer 521 and the conductor layer 592. The through hole T13 is connected to a portion near the first end 592a of the conductor layer 592 (refer to FIG. 16 and FIG. 17). The conductor layer 592 is not directly connected to the ground conductor layer 681.

The filter 1 according to the present embodiment includes a through hole T14 instead of the through hole T4 of the first embodiment. In the present embodiment, the resonator 15 is composed of the resonator conductor layer 595 and the through hole T14. The through hole T14 connects the ground conductor layer 521 and the conductor layer 595. The through hole T4 is connected to a portion near the first end 595a of the conductor layer 595 (refer to FIG. 16 and FIG. 17). The conductor layer 595 is not directly connected to the ground conductor layer 681.

In the present embodiment, the ground conductor layer 521 corresponds to a "first ground conductor layer" of the present invention. The ground conductor layer 681 corresponds to a "second ground conductor layer" of the present invention.

The configuration, function and effects of the present embodiment are otherwise the same as those of the first embodiment.

The present invention is not limited to the foregoing embodiments, and various modifications may be made thereto. For example, a filter of the present invention is not limited to a band-pass filter and may be a filter including a plurality of resonators other than a band-pass filter. The number of the plurality of resonators is not limited to six and may be five or less or seven or more.

Only either one of the plurality of through holes T9A and the plurality of through holes T9B may be connected to the resonator conductor layer 591 constituting the resonator 11. Similarly, only either one of the plurality of through holes T9A and the plurality of through holes T9B may be connected to the resonator conductor layer 593 constituting the resonator 13. Similarly, only either one of the plurality of through holes T9A and the plurality of through holes T9B may be connected to the resonator conductor layer 594 constituting the resonator 14. Similarly, only either one of the plurality of through holes T9A and the plurality of through holes T9B may be connected to the resonator conductor layer 596 constituting the resonator 16.

As described above, a filter of the present invention includes: a first terminal; a second terminal; a first ground conductor layer and a second ground conductor layer each connected to ground and arranged to be spaced from each other; a first resonator conductor layer arranged between the first ground conductor layer and the second ground conductor layer and constituting a part of a first specific resonator provided between the first terminal and the second terminal in circuit configuration; a first through hole connecting the first ground conductor layer and the first resonator conductor layer and constituting a different part of the first specific resonator; and a body composed of a dielectric and integrating the first terminal, the second terminal, the first ground conductor layer, the second ground conductor layer, the first resonator conductor layer, and the first through hole. The first resonator conductor layer is not directly connected to the second ground conductor layer.

The filter of the present invention may further include a plurality of resonators provided between the first terminal and the second terminal in circuit configuration. At least one of the plurality of resonators may be formed by using the first resonator conductor layer and the first through hole. The filter of the present invention may further include: a second resonator conductor layer arranged between the first ground conductor layer and the second ground conductor layer and constituting a second specific resonator provided between the first terminal and the second terminal in circuit configuration; and at least one second through hole connecting the second ground conductor layer and the second resonator conductor layer. At least one of the plurality of resonators other than the at least one of the plurality of resonators may be formed by using the second resonator conductor layer.

The filter of the present invention may further include at least one third through hole connecting the first ground conductor layer and the second resonator conductor layer. The at least one second through hole and/or the at least one third through hole may be more than one. The at least one second through hole and the at least one third through hole may be different in number.

Each of the plurality of resonators may be a single-ended short-circuit resonator. The plurality of resonators may be configured so that each two resonators adjacent to each other in circuit configuration are electromagnetically coupled.

The filter of the present invention may further include a first resonator and a second resonator each formed by using the first resonator conductor layer and the first through hole. The first resonator conductor layer of each of the first resonator and the second resonator may extend in a direction in which the first through hole of the first resonator and the first through hole of the second resonator are aligned. The first resonator conductor layer of the first resonator and the first resonator conductor layer of the second resonator may have shapes symmetric to each other with respect to a virtual plane located between the first through hole of the first resonator and the first through hole of the second resonator and intersecting the direction in which the first through hole of the first resonator and the first through hole of the second resonator are aligned. The first resonator conductor layer may have a first end and a second end located at both respective ends in a longitudinal direction of the first resonator conductor layer. The first through hole may be connected to a portion near the first end of the first resonator conductor layer. The first resonator conductor layer of one of the first resonator and the second resonator may extend from the first end toward the second end in a manner of coming away from or closer to the other one of the first resonator and the second resonator.

In the filter of the present invention, the body may have a first surface facing a mounted body and a second surface opposite to the first surface. The first ground conductor layer may be arranged at a position closer to the first surface than the second ground conductor layer is. In this case, the second ground conductor layer may be arranged at a position closer to the second surface than the first ground conductor layer is. Alternatively, the first ground conductor layer may be arranged at a position closer to the second surface than the second ground conductor layer is. In this case, the second ground conductor layer may be arranged at a position closer to the first surface than the first ground conductor layer is.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. A filter comprising:
a first terminal;
a second terminal;
a first ground conductor layer arranged and spaced from a second ground conductor layer, each of the first ground conductor layer and the second ground conductor layer being connected to ground;
a plurality of resonators provided between the first terminal and the second terminal in circuit configuration;
a first resonator conductor layer and a second resonator conductor layer each arranged between the first ground conductor layer and the second ground conductor layer;

a first through hole connecting the first ground conductor layer and the first resonator conductor layer;
at least one second through hole connecting the second ground conductor layer and the second resonator conductor layer; and
a body composed of a dielectric and integrating the first terminal, the second terminal, the first ground conductor layer, the second ground conductor layer, the plurality of resonators, the first resonator conductor layer, the second resonator conductor layer, the first through hole, and the second through hole, wherein:
the first resonator conductor layer is not directly connected to the second ground conductor layer;
at least one of the plurality of resonators is formed by using the first resonator conductor layer and the first through hole; and
at least one of the plurality of resonators other than the at least one of the plurality of resonators is formed using the second resonator conductor layer.

2. The filter according to claim 1, wherein
the body includes a first surface facing a mounted body and a second surface opposite to the first surface,
the first ground conductor layer is arranged at a position closer to the first surface than the second ground conductor layer is, and
the second ground conductor layer is arranged to a position closer to the second surface than the first ground conductor layer is.

3. The filter according to claim 1, wherein
the body includes a first surface facing a mounted body and a second surface opposite to the first surface,
the first ground conductor layer is arranged at a position closer to the second surface than the second ground conductor layer is, and
the second ground conductor layer is arranged to a position closer to the first surface than the first ground conductor layer is.

4. The filter according to claim 1, further comprising at least one third through hole connecting the first ground conductor layer and the second resonator conductor layer.

5. The filter according to claim 4, wherein
at least one of the at least one second through hole and the at least one third through hole is more than one, and
the at least one the second through hole and the at least one third through hole are different in number.

6. The filter according to claim 1, wherein each of the plurality of resonators is a single-ended short-circuit resonator.

7. The filter according to claim 1, wherein the plurality of resonators are configured in a manner that each two resonators adjacent to each other in circuit configuration are electromagnetically coupled to each other.

8. The filter according to claim 1, further comprising a first resonator and a second resonator each formed by using the first resonator conductor layer and the first through hole.

9. The filter according to claim 8, wherein
the first resonator conductor layer of each of the first resonator and the second resonator extends in a direction in which the first through hole of the first resonator and the first through hole of the second resonator are aligned.

10. The filter according to claim 9, wherein
the first resonator conductor layer of the first resonator and the first resonator conductor layer of the second resonator have shapes symmetric to each other with respect to a virtual plane located between the first through hole of the first resonator and the first through hole of the second resonator and intersecting the direction in which the first through hole of the first resonator and the first through hole of the second resonator are aligned.

11. The filter according to claim 9, wherein
the first resonator conductor layer includes a first end and a second end located at respective longitudinal ends of the first resonator conductor layer,
the first through hole is connected to a portion near the first end of the first resonator conductor layer, and
the first resonator conductor layer of one of the first resonator and the second resonator extends from the first end toward the second end in a manner that the first resonator conductor layer comes away from or closer to another one of the first resonator and the second resonator.

12. A filter comprising:
a first terminal;
a second terminal;
a first ground conductor layer and a second ground conductor layer each connected to ground and arranged to be spaced from each other;
a first resonator conductor layer arranged between the first ground conductor layer and the second ground conductor layer;

a first through hole connecting the first ground conductor layer and the first resonator conductor layer;
a first resonator and a second resonator each formed by using the first resonator conductor layer and the first through hole; and
a body composed of a dielectric and integrating the first terminal, the second terminal, the first ground conductor layer, the second ground conductor layer, the first resonator, the second resonator, the first resonator conductor layer, and the first through hole, wherein the first resonator conductor layer is not directly connected to the second ground conductor layer,
the first resonator conductor layer of each of the first resonator and the second resonator extends in a direction in which the first through hole of the first resonator and the first through hole of the second resonator are aligned,
the first resonator conductor layer includes a first end and a second end located at respective longitudinal ends of the first resonator conductor layer,
the first through hole is connected to a portion near the first end of the first resonator conductor layer, and
the first resonator conductor layer of one of the first resonator and the second resonator extends from the first end toward the second end in a manner that the first resonator conductor layer comes away from or closer to another one of the first resonator and the second resonator.

* * * * *